United States Patent [19]

Stewart et al.

[11] 4,342,079
[45] Jul. 27, 1982

[54] DUPLICATED MEMORY SYSTEM HAVING STATUS INDICATION

[75] Inventors: Charles G. Stewart, Hazeldean; Prem L. Sood, Richmond, both of Canada

[73] Assignee: Northern Telecom Limited, Montreal, Quebec, Canada

[21] Appl. No.: 46,101

[22] Filed: Jun. 6, 1979

[30] Foreign Application Priority Data

May 15, 1979 [CA] Canada ................................. 327649

[51] Int. Cl.³ .............................................. G06F 13/00
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,633,175 | 1/1972 | Harper | 364/200 |
| 3,668,644 | 6/1972 | Looschen | 364/200 |
| 3,768,074 | 10/1973 | Sharp et al. | 364/200 |
| 3,866,182 | 2/1975 | Yamada et al. | 364/200 |
| 3,997,896 | 12/1976 | Cassarino, Jr. et al. | 364/200 |

FOREIGN PATENT DOCUMENTS

876366  7/1971  Canada ................................. 364/200

Primary Examiner—Raulfe B. Zache
Attorney, Agent, or Firm—Robert C. Hogeboom

[57] ABSTRACT

A fully duplicated memory system for a single central processing unit (CPU) is disclosed. The memory system comprises a primary and a secondary control unit and a primary memory bank and a secondary memory bank. Each memory bank comprises one memory controller and a plurality of memory modules (e.g. six memory modules). Each memory module stores a plurality of binary words in distinct addressable storage locations with a unique address code defining both one distinct addressable storage location in a memory module in the first memory bank and one distinct addressable storage location in a memory module in the second memory bank. A random access memory (RAM) stores an indication of the read and write status of each memory module in both the first and second memory banks. One of the control units, responsive to both the CPU and the RAM determines which memory bank (primary or secondary) is accessed in response to a read or a write command from the CPU addressed to the memory banks.

14 Claims, 5 Drawing Figures

DUPLICATED MEMORY SYSTEM HAVING STATUS INDICATION

This invention relates generally to memory systems for use with a central processing unit (CPU), and more particularly to a duplicated memory system that can be used with one CPU.

BACKGROUND OF THE INVENTION

It is well known in the art to use duplicated systems. Canadian Pat. No. 876,366 dated July 20, 1971 to R. W. Downing; J. S. Nowak; F. F. Taylor, and W. Ulrich depicts a duplicated system comprising two "central controls", a memory system comprising a plurality of independent memories, and a plurality of independent transmission paths; these component parts are then arranged into two independent (i.e. duplicated) combinations. Each combination comprises one of the "central controls", selected ones of the independent memories, and selected ones of the independent transmission paths (see pages 3 and 4 of the aforementioned Canadian patent).

Canadian Pat. No. 876,366 states that: "It is a feature of this invention that since the transmission paths are selectively connectable to both central controls and to each of the plurality of independent memories, it is possible to provide an operable combination of central control, memory, and transmission paths even though multiple troubles may exist in the overall data processing system. Furthermore, . . . the first and the second central controls concurrently perform identical work functions, . . . " (page 4, lines 12 to 20).

U.S. Pat. No. 3,768,074 dated Oct. 23, 1973 to R. S. Sharp and H. P. Birchmeler depicts a system which "includes a plurality of processing groups each including a processing unit, an I/O control unit and the like, which groups may be partitioned into separate subsystems, each subsystem including at least one processing group". (Column 2, lines 61 to 65.) The patent continues to state at column 3, lines 3 to 13, "Features of the present invention reside in a plurality of representative unis provided for each of the processing groups which representative units receive system configuration codes specifying the particular sub-system to which the processing groups are to be joined. Each representative unit transmits its own system configuration code to all the other representative units and receives system configuration codes in turn. In this manner, processing groups having been assigned the same system configuration codes will then be joined as a subsystem."

U.S. Pat. No. 3,633,175 dated Jan. 4, 1972 by S. D. Harper depicts "a novel memory access construction in which a memory that initially has defective storage locations is associated with a set of auxiliary storage locations. Where the memory is fabricated as an integrated circuit on a semiconductor chip, the auxiliary locations can be in the same chip, or in different, and also partly defective, chips. A content addressable memory (CAM) is provided having an argument section with a number of locations, each of which is capable of storing the address of one defective location in the main memory. The content addressable memory also has a function section in which, for each address that can be stored in the argument section, there is a corresponding memory location for storing the address of an auxiliary location." (Column 1, lines 49 to 61.) This patent continues to state at column 1, lines 69 to 75, "When the CAM determines that the address currently in the memory address register is the same as an address in the argument section, i.e. is the address of a defective main memory location, the CAM supplies, from its function section, an auxiliary address to the address decoder driver. This directs the information exchange to a spare address location that has been assigned to that defective main memory location."

SUMMARY OF THE INVENTION

The present invention comprises a duplicated memory system for a single, central processing unit (CPU). The memory system comprises a primary and a secondary control unit and a primary memory bank and a secondary memory bank. Each memory bank comprises one memory controller and a plurality of memory modules.

The primary control unit is responsive to signals from the CPU and, as will be explained in more detail later, the primary control unit determines which memory modules (i.e. one in the primary memory bank or one in the secondary memory bank, or one in each) should be accessed. The primary control unit includes a storage device (a random access memory, RAM) which keeps track of the read and write status of the primary and secondary memory modules. If the primary control unit does not contain an inhibit (stored in the RAM) for a certain memory module, then if that module gets addressed by the CPU for a write command, it gets written. Similarly, if a certain memory module gets addressed by the CPU for a read command, that memory module is addressed and the data transferred to the primary control unit from both the primary and secondary memory banks if neither is inhibited. If the data transmitted passes the parity check, priority is given to the primary memory bank to pass the data from that source to the CPU; the data from the secondary memory bank is blocked. If one of the memories produces data with a parity error, transmission of that data is blocked and the status of that memory module is stored in both the primary and secondary control units as being inhibited for future read commands.

The primary and secondary control units are identical in construction; they gain their distinction according to which one interfaces with the CPU. The control unit that interfaces with the CPU is the primary control unit; either one of the control units has the capacity to interface with the CPU, and in the preferred embodiment an auxiliary CPU is provided, ready to be connected to the "secondary" control unit in case of a failure of the first CPU. However, only one CPU is working at any given instant in time, and the other CPU is not an active part of the system. Note that the information (data, address, and control) applied to the secondary memory bank by the primary control unit is routed via the secondary control unit; this can be considered a master-slave type of arrangement.

Stated in other terms, the present invention is a duplicated memory system for use with a central processing unit (CPU) wherein the memory system comprises: first and second memory banks, each memory bank comprising a plurality of memory modules for storing a plurality of binary words in distinct addressable storage locations, with a unique address code defining both one distinct addressable storage location in a memory module in the first memory bank and one distinct addressable storage location in a memory module in the second memory bank; status storage means, for storing an indication of the read status of each memory module in both the first and second memory banks; control means, responsive both to the CPU and to the storage means, for selectively accessing the distinct addressable storage locations in the first and second memory banks; and the control means updating the indication, stored in the status storage means, of the read status of each memory module in both the first memory bank and the second memory bank after each memory module has been accessed for a read operation by the control means.

Stated in yet other terms, the present invention is a duplicated memory system for use with a central processing unit (CPU) wherein the memory system comprises: a first memory bank and a second memory bank, each of the memory banks comprising a plurality of memory modules for storing a plurality of binary words in distinct addressable storage locations, with a unique address code defining both one distinct addressable storage location in a memory module in the first memory bank and one distinct addressable storage location in a memory module in the second memory bank; a random access memory (RAM), for storing a binary indication of both the read status and the write status of each memory module in both the first memory bank and the second memory bank; control means, responsive both to the CPU and to the RAM, for selectively accessing the distinct addressable storage locations both in the first memory bank and in the second memory bank; the control means updating the binary indication, stored in the RAM, of the read status and the write status of each memory module in both the first memory bank and the second memory bank after each memory module has been accessed by the control means.

Stated in still different terms, in a duplicated memory system for use with a central processing unit (CPU) wherein the duplicated memory system comprises a first memory bank and a second memory bank, each of the memory banks comprising a plurality of memory modules for storing a plurality of binary words in distinct addressable storage locations, with a unique address code defining both one addressable storage location in a memory module in the first memory bank and one addressable storage location in a memory module in the second memory bank, the method of operating the duplicated memory system characterized by: storing, in a status storage means, both the read status and the write status of each memory module in both the first memory bank and the second memory bank; supplying the duplicated memory system with a unique address code that defines both one distinct addressable storage location in a memory module in the first memory bank and one distinct addressable storage location in a memory module in the second memory bank; supplying the duplicated memory system with a control command either to read data information from the addressed location or to write data information into the addressed location; selectively accessing, in response to both the control command and the read and write status, the addressable storage locations in the first and second memory banks; and storing, in the status storage means, the updated read status and write status of each memory module after each memory module has been accessed.

The invention will now be described in more detail with reference to the accompanying drawings, wherein like parts in each of the several figures are identified by the same reference characters, and wherein:

FIG. 1 is a simplified block diagram depicting the duplicated memory system of the present invention and its interconnection to a CPU;

FIGS. 2b and 2a referred to collectively as FIG. 2, depict primary control unit 19 and secondary control unit 21, respectively of FIG. 1 and their interconnection in simplified block diagram form;

DETAILED DESCRIPTION

Figure 1:
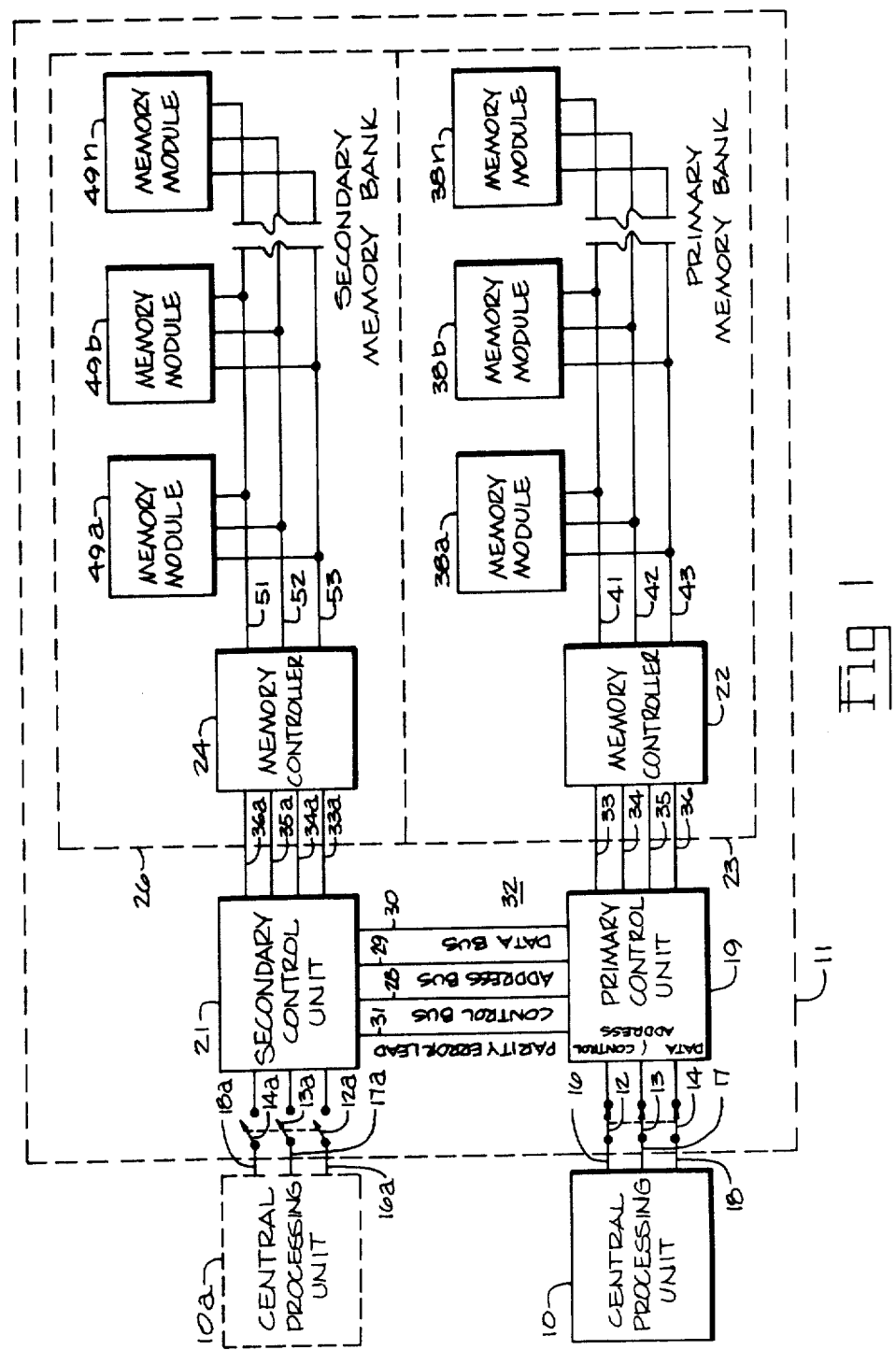

FIG. 1 is a simplified block diagram depicting a central processing unit (CPU) 10 connected to a duplicated memory system 11. Switches 12, 13 and 14 (shown in simplified form) are ganged to operate in unison (as indicated by the dashed line interconnecting them) and function to connect CPU 10 to memory system 11 via control bus 16, address bus 17, and data bus 18. The connection of CPU 10 to memory 11 is made via primary control unit 19.

Primary control unit 19 interfaces with both secondary control unit 21 and memory controller 22 of the primary memory bank 23. Secondary control unit 21 interfaces with memory controller 24 of secondary memory bank 26. The interface between primary control unit 19 and secondary control unit 21 is via interconnect bus 32 comprising: control bus 28, address bus 29, data bus 30, and parity error lead 31. The interface between primary control unit 19 and memory controller 22 is via parity error lead 33, control bus 34, address bus 35, and data bus 36. Memory controller 22 then interconnects to the individual memory modules 38a, 38b, to 38n via control bus 41, address bus 42, and data bus 43. In the preferred embodiment of the invention there are six memory modules 38a, 38b, 38c, 38d, 38e and 38f, which will be referred to collectively as memory modules 38.

In a similar fashion, secondary control unit 21 is interconnected to memory controller 24 via parity error lead 33a, control bus 34a, address bus 35a, and data bus 36a. Memory controller 24 then interconnects to the individual memory modules 49a, 49b to 49n via control bus 51, address bus 52, and data bus 53. In the preferred embodiment of the invention there are six memory modules 49a, 49b, 49c, 49d, 49e, and 49f which will be referred to collectively as memory modules 49; note that it is preferable to have the number of memory modules 38 equal the number of memory modules 49. Additionally, in the preferred embodiment, each memory module 38 and each memory module 49 is capable of storing 65,536 words of data, (each word being seventeen bits long). It should be noted that memory modules 38 (as well as memory modules 49) contain many distinct addressable storage locations, each location having a unique address code, and each location storing a data word. It should also be noted that for every distinct addressable storage location in memory module 38a, there is one distinct addressable storage location in memory module 49a that has an identical address code. Similarly for memory modules 38b and 49b and so on, to and including memory modules 38n and 49n. In short every time a memory bank address code appears on address bus 17 it defines both one distinct addressable storage location in a memory module 38 in primary memory bank 23 and one distinct addressable storage location in a memory module 49 in secondary memory bank 26. Which memory module 38 or 49 is in fact accessed in response to a command on control bus 16 depends upon control logic 58 (FIG. 3) part of control unit 19, which will be discussed later in more detail.

In simplified terms the operation of the FIG. 1 embodiment is as follows. The CPU 10 communicates with primary control unit 19 over buses 16, 17 and 18. There are two basic commands which CPU 10 can issue over control bus 16; they are a read command and a write command. Primary control unit 19 includes a random access memory (RAM) 66 (FIG. 4) which stores the read and write status of each individual memory module 38 in primary memory bank 23 and also the read and write status of each individual memory module 49 in secondary memory bank 26; this RAM 66 will be described in more detail later in this specification, in reference to FIG. 4.

When primary control unit 19 receives a write command from CPU 10, the RAM 66 in unit 19 is checked to determine the "write status" of both the memory module 38 that has been addressed in the primary memory bank 23, and also the memory module 49 that has been addressed in the secondary memory bank 26. It should be noted that the addresses are the same for both the memory modules 38 and 49; i.e. a single unique address code defines one distinct addressable storage location in one particular module 38 of primary memory bank 23, and the same address also defines one distinct addressable storage location in one particular module 49 of secondary memory bank 26. Returning to RAM 66, if it does not contain a write inhibit for either the addressed memory module 38 or 49, then the information sent on data bus 18 is written into the memory location addressed in each of the appropriate modules 38 and 49. If one (or both) of the modules 38 and 49 are indicated, by RAM 66, as being "write inhibited" then the command on control bus 16 is prevented, by control unit 19, from being applied to that memory module.

Similarly, when primary control unit 19 receives a read command from CPU 10, RAM 66 in unit 19 is checked to determine the "read status" of both the memory modules 38 and 49 that have been addressed. Both addressed locations in modules 38 and 49 are read, but only the data from the module that is indicated as not being "read inhibited" is passed by unit 19; unit 19 causes the data from the module that is "read inhibited" to be blocked. If neither module 38 nor 49 is indicated as being read inhibited then priority is given to module 38 from the primary memory bank 23 and the data from module 49 in secondary memory bank 26 is caused to be blocked by unit 19.

The RAM 66 contained within primary control unit 19 is updated automatically by unit 19 in response to parity checks on the data. If a read command results in data from one of the modules 38, 49 failing to pass the parity check then the RAM 66 is loaded with a read inhibit and a write inhibit for that particular module. The RAM 66 can also be loaded directly via CPU 10 for initialization or for various maintenance tasks. It should be noted that secondary control unit 21 also includes a RAM 66a that serves the same function as the RAM 66 in unit 19, when the secondary control unit 21 is accessed directly by CPU 10a. Normally the RAMs 66 and 66a in both units 19 and 21 have stored within themselves identical information regarding the read and write status of the various modules 38 and 49; the exception to this occurs when CPU 10 accesses only one of the RAMs 66, 66a to modify data therein, such as during a diagnostic memory test of one of the modules 38 and 49.

So far, the system of FIG. 1 has been described for use with only a single CPU, namely CPU 10. In the preferred embodiment of the invention a second CPU, CPU 10a, is employed as an auxiliary CPU which does not normally form an active part of the circuit. However, if a fault occurs in CPU 10, switches 12, 13 and 14 are opened, and switches 12a, 13a and 14a are closed. This of course results in CPU 10 being disconnected from the circuit and CPU 10a being connected to the circuit via switches 12a, 13a and 14a, and via control bus 16a, address bus 17a, and data bus 18a. It should be noted that only one of the CPUs 10, 10a is active and functioning as a part of the circuit at any given time period; this is why CPU 10a is indicated by dashed lines.

Figure 2A:
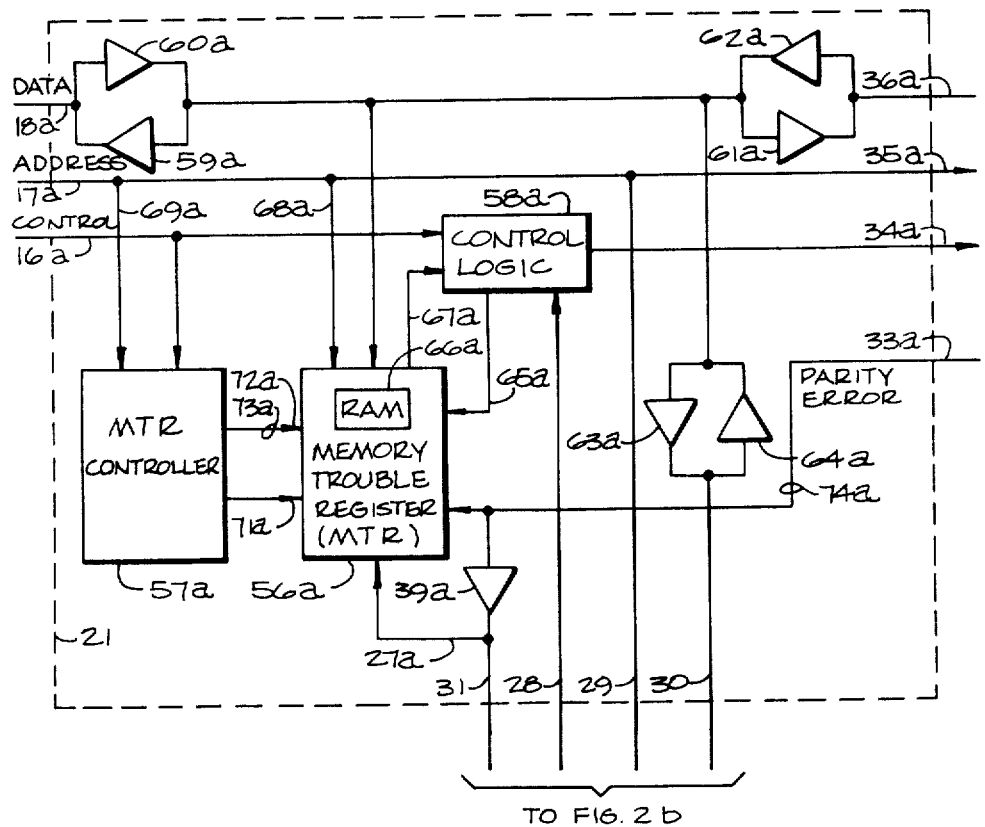
Figure 2B:
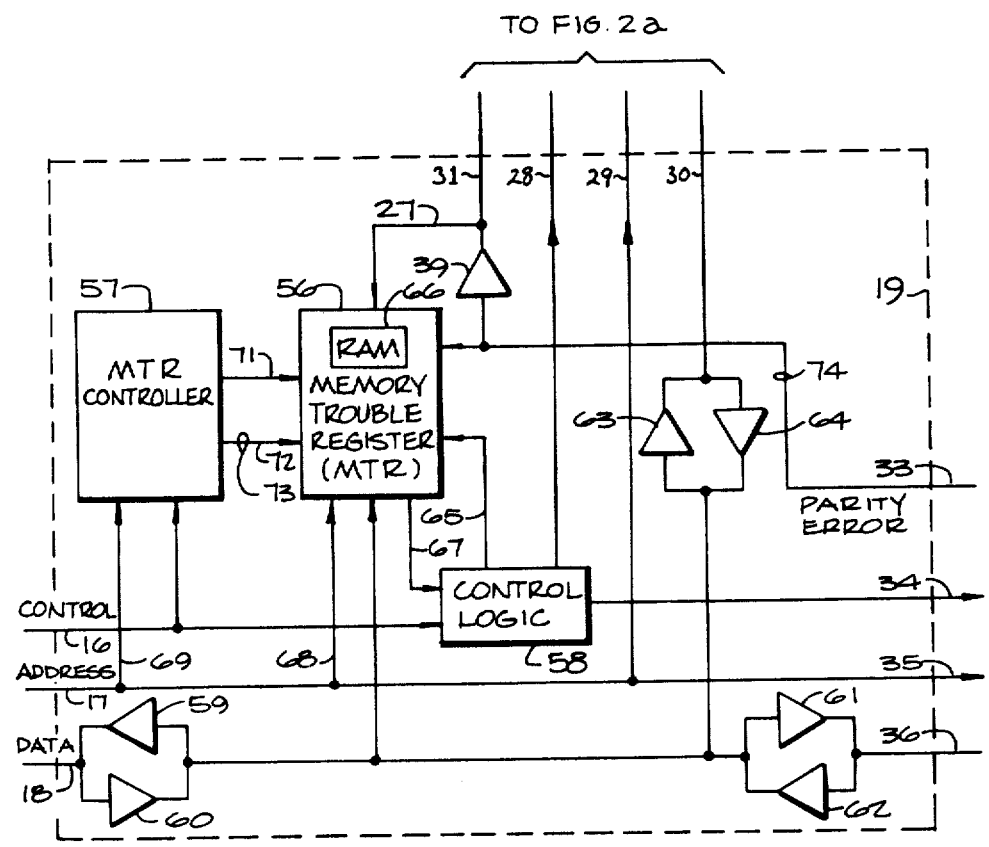

FIGS. 2b and 2a, depicting primary control unit 19 and secondary control unit 21 respectively will now be described; FIGS. 2a and 2b will be referred to collectively as FIG. 2. The main logic units of FIG. 2b are memory trouble register (MTR) 56, MTR controller 57 and control logic 58. Control bus 16 supplies the read and the write commands to control logic 58. Control logic 58, as will be explained later in more detail, determines whether the command should be transferred to a memory module 38 in the primary memory bank (FIG. 1) via control bus 34, or whether the command should be transferred to a memory module 49 in the secondary memory bank 26 (FIG. 1) via control bus 28, or to both memory modules 38 and 49. As can be seen from FIG. 2b, address bus 17 diverges into a first address bus 35 that goes to primary memory bank 23 and a second address bus 29 that goes to FIG. 2b and then to address bus 35a of that Figure. It should be noted that secondary control unit 21 has the same electrical construction as does primary control unit 19; the only difference being that when primary control unit 19 is controlled by CPU 10, secondary control unit 21 is not connected to a CPU and is controlled by primary control unit 19. Note also that when secondary control unit 21 is connected to CPU 10a, primary control unit 19 is not connected to CPU 10; secondary control unit 21 is then controlled by CPU 10a and primary control unit 19 is controlled by secondary control unit 21. This can be considered a master-slave arrangement wherein the control unit (19 or 21) which is connected to a CPU is the master, and the other control unit (19 or 21) is the slave.

The data is transmitted from CPU 10 to control unit 19 via data bus 18. The data is transmitted by control unit 19 either to primary memory bank 23 via data bus 36 or to secondary memory bank 26 via data bus 30 to control unit 21 and from there via data bus 36a to secondary memory bank 26. The control of this data is via buffers 59, 60, 61, 62, 63 and 64 in control unit 19 and via buffers 59a, 60a, 61a, 62a, 63a and 64a in control unit 21. These two groups of buffers are controlled by control logic 58 and 58a, respectively, via control lines (not shown) so as to control the flow of data as required, to and from the primary memory bank 23 and the secondary memory bank 26. For example, if the data is to be applied to primary memory bank 23 but not to secondary memory bank 26, then buffers 60 and 61 are on and buffers 59, 62, 63 and 64 are off.

The operation of control bus 16, MTR controller 57, MTR 56, and control logic 58 will now be described in greater detail. As stated earlier, MTR 56 contains a random access memory (RAM) 66 in which is stored the read status and the write status of the individual primary memory modules 38 and the read status and the write status of the individual secondary memory modules 49. In the preferred embodiment of the invention, RAM 66 is capable of storing sixteen four-bit words (although only twelve words are actually stored in the preferred embodiment). This occurs because each memory module 38 and each memory module 49 is treated as though it were two modules, each one-half the size of the actual memory module. Since we have six modules 38, 49, each divided into one-half, we have effectively twelve modules (2×6=12) which is why twelve words are used in RAM 66. The first two bits of each word store the read and write status of the secondary memory modules 49, and the second two bits of the same word store the read and write status of the corresponding primary memory modules 38; note that memory modules 38a and 49a correspond, memory modules 38b and 49b correspond, etc. One four-bit word is needed for each combination of memory modules 38 and 49; consequently RAM 66 can store the read and write status for sixteen memory modules 38 and sixteen memory modules 49. The contents of RAM 66 (as displayed at its output) can be described as follows:

| Bit 1 | Bit 2 | Bit 3 | Bit 4 | Associated Memory Module |
|-------|-------|-------|-------|--------------------------|
| SW    | SR    | PW    | PR    | 38a and 49a              |
| SW    | SR    | PW    | PR    | 38b and 49b              |
| .     | .     | .     | .     |                          |
| .     | .     | .     | .     |                          |
| .     | .     | .     | .     |                          |
| SW    | SR    | PW    | PR    | 38n and 49n              |

Where SW represents secondary write, SR represents secondary read, PW represents primary write, and PR represents primary read. SW, SR, PW, and PR are of course stored in RAM 66 as either a logic 1 or a logic 0. In the preferred embodiment a logic 1 means that that particular memory module is inhibited; a logic 0 means that the particular memory module is active and is available for a read or a write command, as the case may be. As an example, if the first line in the preceding chart depicting the contents of RAM 66 consists of 1, 0, 0, 0 this means that there is an inhibit on the secondary write (i.e. SW=1) and no data will be written into memory module 49a; SR=0 so that data can be read from memory module 49a; PW=0 so that data can be written into memory module 38a; and PR=0 so that data can be read from memory module 38a.

Every time a read or write command appears on control bus 16, control logic 58 produces a logic 1 on line 65 which is applied to MTR 56. Additionally, MTR controller 57 produces a logic signal 73 on line 72 which is a logic 1 in response to either a read or write command appearing on control bus 16; this signal 73 is then appropriately timed (by circuitry not shown) to return to a logic 0; the purpose of this returning to logic 0 will be discussed later. In response to the logic 1 signal on line 72, MTR 56 outputs on status bus 67, the contents $\overline{SW}$, $\overline{SR}$, $\overline{PW}$, and $\overline{PR}$ corresponding to the memory module 38 and 49 that has been addressed.

If the command on control bus 16 is to write, then control logic 58 routes this command to both the primary memory bank 23 via control bus 34 and to secondary memory bank 26 via control bus 28 and secondary control unit 21, if SW=0 and PW=0. If SW=1, then the write control is sent only to primary memory bank 23; if PW=1, then the write command is sent only to secondary memory bank 26. If both SW=1 and PW=1 then control logic 58 prevents the write command from going to either memory bank 23 or 26. The address is of course applied to both memory banks 23 and 26 in any case. The buffers 59, 62 and 64 are turned off via logic 58 by control lines not shown; buffer 60 is turned on via logic 58; buffer 61 is turned on if it is desired to write data into primary memory bank 23 and is turned off otherwise; and buffer 63 is turned on if it is desired to write data into secondary memory bank 26 and is turned off otherwise.

If the command on control bus 16 is to read, then control logic 58 routes this command to both the primary memory bank 23 via control bus 34 and to secondary memory bank 26, via control bus 28 and secondary control unit 21, if SR=0 and PR=0. If both SR=0 and PR=0 then priority is given to the data that is read from primary memory bank 23. This is done by turning off buffers 63 and 64; buffer 62 is turned on, as is buffer 59, and of course buffers 60 and 61 are turned off. Because of this, if a parity error is detected during a read from the primary memory bank 23 (via lead 33), the data can be read from the secondary memory bank 26 by switching buffer 62 off and buffer 64 on. As will be discussed later, this parity error also results in the PR bit and the PW bit in the appropriate word stored in RAM 66 being changed to logic 1 so that the memory module 38 that was accessed will not again be accessed.

If SR=1 and PR=0, when a read command appears on control bus 16, then the read command is sent only to primary memory bank 23; if PR=1 and SR=0, then the read command is sent only to secondary memory bank 26. If both SR=1 and PR=1 then control logic 58 prevents the read command from going to either memory bank 23 or 26. The address is of course applied to both memory banks 23 and 26 in any case. The buffers 60, 61 and 63 are turned off via logic 58 by control lines not shown; buffer 59 is turned on via logic 58; buffer 62 is turned on if it is desired to read data from primary memory bank 23 and is turned off otherwise; and buffer 64 is turned on if it is desired to read data from secondary memory bank 26 and is turned off otherwise.

Note that buffers 39 and 39a control the routing of the parity error signal 74 on lead 33 and the parity error signal 74a on lead 33a. When CPU 10 is operational and connected to primary control unit 19, buffer 39 is turned off and buffer 39a is turned on so that parity error signal 74a on lead 33a is fed to parity error lead 31 (via buffer 39a) and thence to parity error lead 27. When CPU 10a is operational and connected to secondary control unit 21, buffer 39 is turned on and buffer 39a is turned off so that parity error signal 74 on lead 33 is fed to parity error lead 31 (via buffer 39) and thence to parity error lead 27a. Buffer 39 is controlled by control logic 58 (by lines not shown) and buffer 39a is controlled by control logic 58a (by lines not shown).

As stated previously, the RAMs 66 and 66a normally have stored within themselves identical information regarding the read and write status of the various modules 38 and 49. When CPU 10 is operational, RAM 66 stores this data in response to parity error signal 74 on lead 33 and parity error signal 74a on lead 27 (via lead 33a, buffer 39a, and lead 31); RAM 66a is supplied with its data by CPU 10.

Before proceeding further in the description, a brief explanation of the data and the addressing scheme employed in the preferred embodiment may prove helpful and will be discussed briefly. In the preferred embodiment, a binary data word consists of sixteen bits plus one bit which is a parity bit in order to provide a check on the integrity of the data as is known in the art. Consequently the data word comprises seventeen bits and can be represented as follows:

DB16, DB15, DB14, DB13, DB12, DB11, DB10, DB09,-DB01, DB00 wherein: DB16 represents data bit 16 and is the parity bit; DB15 stands for data bit 15 and is the most significant bit in the data word; similarly for the remainder, with DB00 being data bit zero and the least significant bit in the data word, with the order of significance decreasing uniformly from DB15 to DB00. In actual fact, the data bits DB16 to DB00 are represented by logic 1's and 0's.

In the preferred embodiment, an address word consists of nineteen bits arranged as follows: AB18, AB17, AB16, AB15, AB14, AB13,-AB01, AB00 wherein: AB18 represents address bit 18, and is the most significant bit; AB17 represents address bit 17; similarly for the remainder with AB00 being the least significant bit in the address word, with the order of significance decreasing uniformly from AB18 to AB00. In actual fact the data bits AB18 to AB00 are represented by logic 1's and 0's.

Address bits AB04, AB10, AB11, AB12, AB13, AB14, AB15, AB16, AB17, and AB18 are applied to MTR controller 57 via bus 69; in addition, address bits AB00 to AB03, which define an addressable location in RAM66 or RAM66a are applied to MTR 56 via address bus 68. For an addressed location in RAM 66 or RAM 66a (when CPU10 is directly addressing RAM 66 or RAM 66a and not a memory module 38, 49), address bits AB13, AB14, AB15, and AB18 must all be logic 0's, and address bits AB10, AB11, AB12, AB16, and AB17 must all be logic 1's; if AB04 is a logic 1, then RAM 66 is being addressed as opposed to RAM 66a which is addressed by AB04 being a logic 0. The state of address bits AB05 through AB09 inclusive is not relevant for RAM 66 or RAM 66a address. If address bits AB04, AB10, AB11, AB12, AB16, and AB17 are all logic 1's and if address bits AB13, AB14, AB15, and AB18 are all logic 0's, then line 71 from MTR controller (FIG. 2b) carries a logic 1 signal indicating that CPU 10 is addressing RAM 66 and is not addressing RAM 66a or a memory module 38 or 49. The actual address for RAM 66 is then given by address bits AB00 to AB03 inclusive. Note that when CPU 10 is addressing a memory module 38, 49 only address bits AB16, AB17, and AB18 play a part in addressing RAM 66.

Figure 3:
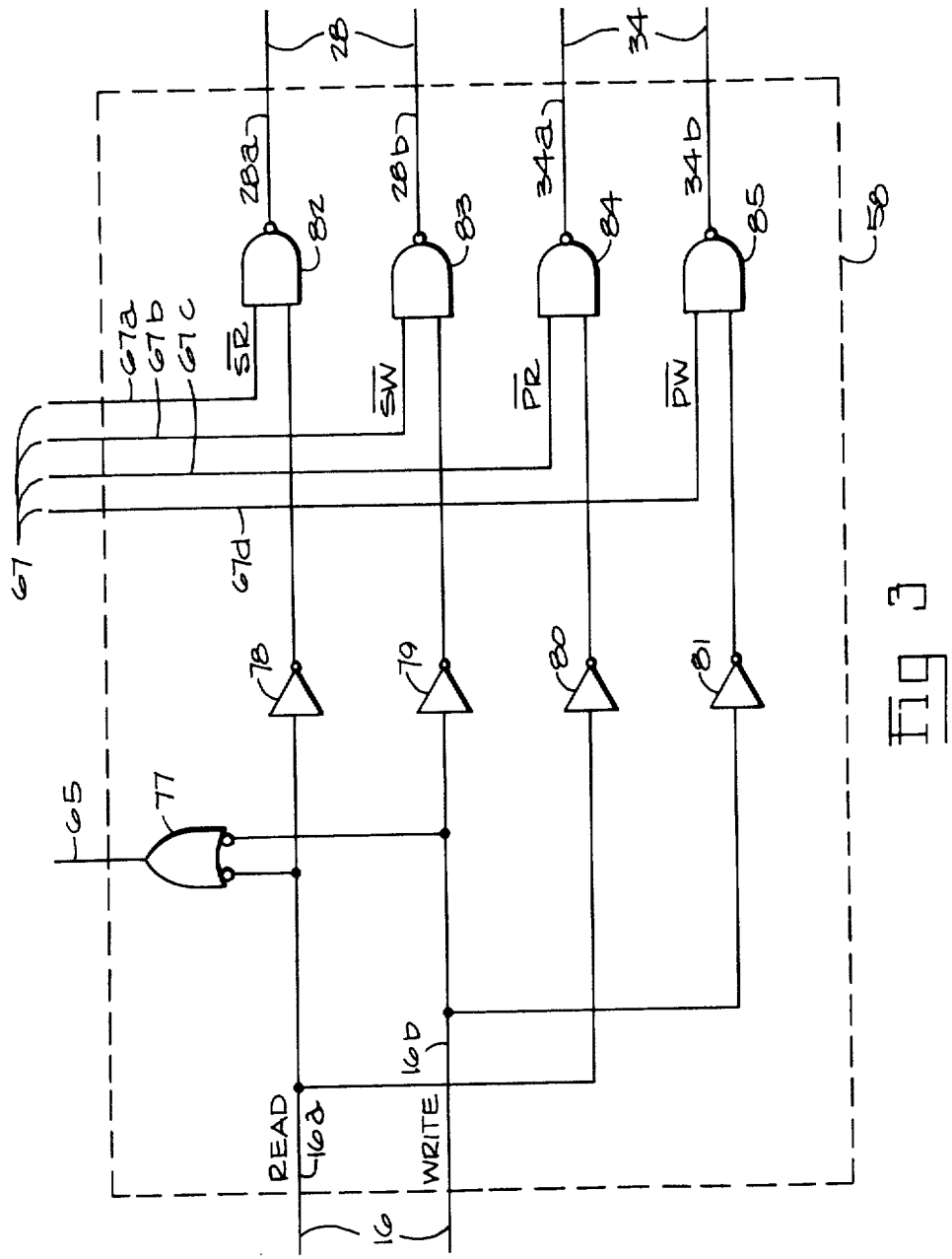
FIG. 3 is a simplified schematic of Control Logic 58 from FIG. 2b.

FIG. 3 depicts control logic 58 and its interconnections in simplified form and will now be described. Control bus 16 comprises a read line 16a and a write line 16b. A logic 0 on line 16a represents a read command and a logic 0 on line 16b represents a write command. Logic gate 77 produces a logic 1 on line 65 every time either a read or a write command appears on control bus 16; otherwise line 65 carries a logic 0. Inverters 78, 79, 80 and 81 each function to invert the logic signals from control bus 16. Lines 67a, 67b, 67c, and 67d (comprising status bus 67) route the read and write status of the memory modules, i.e. $\overline{SR}$, $\overline{SW}$, $\overline{PR}$, and $\overline{PW}$, respectively to the NAND gates 82, 83, 84 and 85 respectively. NAND gate 82 functions such that when line 16a carries a logic 0, its input from inverter 78 is a logic 1, and its input from line 67a is a logic 1 (if there is no inhibit on the particular memory module 49, SR=0 and $\overline{SR}=1$, as indicated by line 67a, being a logic 1) then the output of NAND gate 82 is a logic 0. If line 67a carries a logic 0 (i.e. SR=1 and $\overline{SR}=0$) then the output of NAND gate 82, on line 28a, is a logic 1 and the particular memory module 49 is not read, since a read command on line 28a is indicated by a logic 0. NAND gate 84 functions in a similar manner to send (or block) read commands to a particular memory module 38 via line 34a, part of control bus 34. Line 67c carries a logic 0 when PR=1, and a logic 1 when PR=0.

In a similar fashion NAND gate 83 and 85 function to control the write commands to memory modules 49 and 38 respectively, via lines 28b and 34b, respectively. Note that a logic 0 line 16b indicates a write command and a logic 0 on line 28b and 34b also indicates a write command. Note also that line 67b carries a logic 0 when SW=1 and a logic 1 when SW=0; additionally, line 67d carries a logic 0 when PW=1 and a logic 1 when PW=0. Note that in FIG. 3 certain delays in operation of the logic devices have been omitted in the interest of simplicity and brevity. Clearly, the logic signal carried by line 65 can be transmitted to MTR 56 (FIG. 2b) with a minimum of delay in response to a read or write command on bus 16, but the logic signals on status bus 67 take time to appear and they must be received before a meaningful result is obtained on control buses 28 and 34; appropriate timing delays and clocking signals (not shown) handle this chore.

Figure 4:
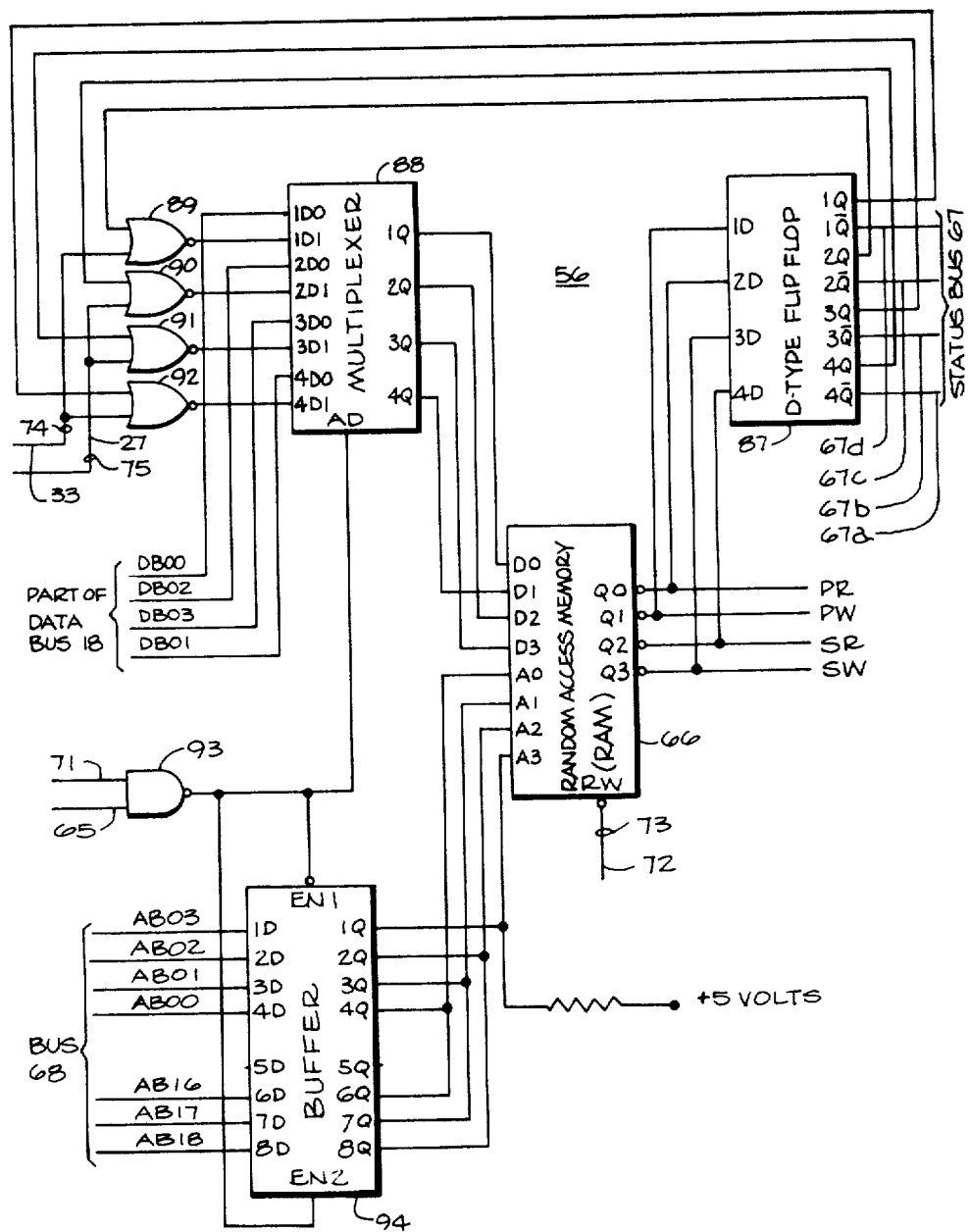
FIG. 4 is a simplified block diagram depicting Memory Trouble Register 56 of FIG. 2b.

Attention will now be directed to FIG. 4 which depicts, in simplified form, memory trouble register 56. MTR 56 comprises a random access memory (RAM)66, a D-type flip-flop 87, a multiplexer 88, NOR gates 89, 90, 91 and 92, NAND gate 93, and buffer 94, all interconnected as shown in FIG. 4.

RAM 66 receives address bits AB00, AB01, AB02, and AB03 on terminals A0, A1, A2 and A3 respectively from address bus 68 and buffer 94 (when the top half of buffer 94 is enabled by terminal EN1, and the lower half is disabled). Logic signal 73 on line 72 is applied to the read-write (RW) input of RAM 66; a logic 0 on line 72 indicates a write command for RAM 66 and a logic 1 on line 72 indicates a read command. The output of RAM 66 is available from terminals Q0, Q1, Q2 and Q3; note that the output is the inverse of what has been stored in RAM 66, which is indicated by the open circle at the terminals Q0, Q1, Q2 and Q3. Note that since the contents of RAM 66 are inverted when output, the complements of the required data, namely $\overline{PR}$, $\overline{PW}$, $\overline{SR}$, and $\overline{SW}$ are stored in RAM 66.

The output signals of RAM 66 are applied to the input of D-type flip-flop 87 as shown in FIG. 4. The outputs of flip-flop 87, taken from output terminals 1Q, 2Q, 3Q and 4Q are applied to one input of NOR gates 89, 90, 91, and 92 respectively, as shown in the Figure. The other outputs of flip-flop 87, namely output terminals $\overline{1Q}$, $\overline{2Q}$, $\overline{3Q}$, and $\overline{4Q}$, carrying the logic signals $\overline{PW}$, $\overline{PR}$, $\overline{SW}$, and $\overline{SR}$ respectively, form status bus 67 comprising lines 67d, 67c, 67b, and 67a respectively.

The other input of NOR gates 89 and 92 is line 33. If an error in the data is detected by memory controller 22 (FIG. 1) then parity error lead 33 carries a logic 1; otherwise it carries a logic 0. The result of a logic 1 on one of the inputs of NOR gate 89 or NOR gate 92 is that the output of the gate is a logic 0. Using NOR gate 89 as an example, if PR is a logic 0, the $\overline{PR}$ as stored in RAM 66 is a logic 1. The input of NOR gate 89, from flip-flop 87, is the logic bit PR and consequently is a logic 0. If parity error lead 33 carries a logic 0 (i.e. no parity error) then the output of NOR gate 89 is a logic 1, which, via multiplexer 88, can be stored in RAM 66 as $\overline{PR}$. If lead 33 carries a logic 1 (i.e. a parity error exists) then the output of NOR gate 89 is a logic 0 (regardless of the state of the other input) and this logic 0 can be stored in RAM 66 as PR, via multiplexer 88. The NOR gates 90, 91, and 92 operate in a similar fashion, with parity error lead 27 originating from parity error lead 31 (FIG. 2a).

Multiplexer 88 functions either to pass the logic signals output from NOR gates 89, 90, 91 and 92 to RAM 66 or to pass logic signals DB00, DB01, DB02, and DB03 from data bus 18 (input to terminals 1D0, 4D0, 2D0, and 3D0 respectively) to RAM 66. When the logic signal applied to terminal AD of multiplexer 88 (i.e. from NAND gate 93) is a logic 0, the multiplexer 88 outputs on its terminals 1Q, 2Q, 3Q, and 4Q the logic signals appearing on its input terminals 1D0, 2D0, 3D0, and 4D0 respectively (i.e. data from data bus 18). When the logic signal applied to terminal AD of multiplexer 88 is a logic 1, the multiplexer 88 outputs on its terminals 1Q, 2Q, 3Q and 4Q the logic signals appearing on its input terminals 1D1, 2D1, 3D1, and 4D1 respectively (i.e. data from NOR gates 89, 90, 91, and 92 respectively).

The input to NAND gate 93 comprises line 71 and line 65 (both from FIG. 2b). Line 71 carries a logic 1 when MTR controller 57 (FIG. 2b) determines by examining the address bits, as explained previously, that MTR 56 is being addressed by CPU 10 or 10a. Line 65 carries a logic 1 signal whenever a read or a write command appears on control bus 16. When both lines 65 and 71 carry logic 1's, the output of NAND gate is a logic 0, and for any other logic inputs it is a logic 1.

When the output of NAND gate 93 is a logic 0, multiplexer 88 produces on its output terminals, data from data bus 18 as previously mentioned. Additionally a logic 0 from NAND gate 93 enables the portion of the buffer 94 controlled by its terminal EN1 (i.e. inputs 1D, 2D, 3D and 4D are connected to outputs 1Q, 2Q, 3Q, and 4Q respectively). Consequently the address bits AB03, AB02, AB01, and AB00 applied to input terminals 1D, 2D, 3D and 4D respectively are applied to input terminals A3, A2, A1, and A0 respectively of RAM 66.

When the output of NAND gate 93 is a logic 1 then multiplexer 88 produces on its output, data from NOR gates 89, 90, 91, and 92 as previously mentioned. Additionally, a logic 1 from NAND gate 93 enables the portion of buffer 94 controlled by its terminal EN2 (i.e. inputs 5D, 6D, 7D, and 8D are connected to outputs 5Q, 6Q, 7Q and 8Q respectively; note that 5D and 5Q are not used). Consequently, the address bits AB16, AB17, and AB18 applied to input terminals 6D, 7D, and 8D respectively are applied to input terminals A0, A1, and A2 respectively, of RAM 66. Terminal A3 of RAM 66 receives a constant logic 1.

In short, when data is being written into RAM 66 by CPU 10, NAND gate 93 produces a logic 0 and RAM 66 receives data from data bus 18 and is addressed by address bits AB00, AB01, AB02, and AB03. When RAM 66 is being written or read in order to determine the status of a particular memory module 38, 49, the output of NAND gate 93 is a logic 1 and RAM 66 receives data from NOR gates 89, 90, 91, and 92 and is addressed by address bits AB16, AB17, and AB18.

In order to simplify the description, the details of the circuitry producing logic signal 73 on line 72 have been omitted. Suffice it to say logic signal 74 is a logic 0 for a write command to RAM 66 and is a logic 1 for a read command to RAM 66. Each read command to RAM 66 is followed by a write command (after an appropriate time delay) so that the contents of RAM 66 can be updated by the data carried by parity error leads 27 and 33 and operated on by NOR gates 89, 90, 91 and 92 as has been explained previously.

What is claimed is:

1. A duplicated memory system for use with a central processing unit (CPU) wherein said memory system comprises:

first and second memory banks, each memory bank system comprising a plurality of memory modules for storing a plurality of binary words in distinct addressable storage locations, with a unique address code defining both one distinct addressable storage location in a memory module in said first memory bank and one distinct addressable storage location in a memory module in said second memory bank;

status storage means, for storing an indication of the read status of each memory module in both said first and second memory banks;

control means, responsive both to said CPU and to said status storage means, for selectively accessing the distinct addressable storage locations in said first and second memory banks; and said control means updating the indication, stored in said status storage means, of the read status of each memory module in both said first memory bank and said second memory bank after each said memory module has been accessed for a read operation by said control means.

2. The duplicated memory system of claim 1 wherein said status storage means is accessed every time said control means receives a read command from said CPU.

3. The duplicated memory system of claim 2 wherein said control means is responsive both to signals from said status storage means and from said CPU for selectively routing the read signals from said CPU both to said first memory bank and to said second memory bank.

4. The duplicated memory system of claims 1, 2 or 3 wherein said first and second memory banks each contain six memory modules; and said status storage means uses two bits to store the status of each memory module in the first memory bank and two bits to store the status of each memory module in the second memory bank.

5. A duplicated memory system for use with a central processing unit (CPU) wherein said memory system comprises:

a first memory bank and a second memory bank, each of said memory banks comprising a plurality of memory modules for storing a plurality of binary words in distinct addressable storage locations, with a unique address code defining both one distinct addressable storage location in a memory module in said first memory bank and one distinct addressable storage location in a memory module in said second memory bank;

a random access memory (RAM), for storing a binary indication of both the read status and the write status of each memory module in both said first memory bank and said second memory bank;

control means, responsive both to said CPU and to said RAM, for selectively accessing the distinct addressable storage locations both in said first memory bank and in said second memory bank;

said control means updating the binary indication, stored in said RAM, of the read status and the write status of each memory module in both said first memory bank and said second memory bank after each said memory module has been accessed by said control means.

6. The duplicated memory system of claim 5, wherein said first memory bank comprises six memory modules, each memory module capable of storing up to 65,536 words of information; and wherein said second memory bank comprises six memory modules, each memory module capable of storing up to 65,536 words of information; each of said words of information containing seventeen bits.

7. A duplicated memory system for use with a central processing unit (CPU) wherein said memory system comprises:
- a first memory bank, comprising a plurality of memory modules for storing a plurality of binary words in distinct addressable storage locations, each said distinct addressable storage location defined by a unique address code;
- a second memory bank, comprising a plurality of memory modules for storing a plurality of binary words in distinct addressable storage locations, each said distinct addressable storage location defined by an address code that is identical to one of the unique address codes defining a distinct addressable storage location in said first memory bank;
- a status storage means containing, in binary format, data bits for indicating if a particular memory module in either the first or the second memory banks is inhibited for either a read or a write command;
- a control circuit means, responsive to both said CPU and said status storage means, for selectively accessing the distinct addressable storage locations in said first and second memory banks;
- both said first memory bank and said second memory bank being receptive to the unique address code supplied by said CPU;
- both said first memory bank and said second memory bank selectively applying data to, and selectively receiving data from, said CPU, under the control of said control circuit means; and
- said control circuit means updating the data bits, stored in said status storage means, after each said memory module has been accessed by said control circuit means.

8. The duplicated memory system of claim 7 wherein a word stored in said status storage means is read in response to either a read or a write command to an addressed location in said first and second memory banks, the address code of said word read from said status storage means being defined by at least part of the unique address code for said addressed location in said memory bank; the execution of said read or write command from said CPU being contingent upon at least one memory module not being inhibited for the particular command to read or write, as determined by the information contained in said word read from said status storage means.

9. The duplicated memory system of claim 8 wherein the inhibit information contained in the addressed location of said word, read from said status storage means, is updated in response to the read or write command from said CPU to an address location in said memory banks.

10. The duplicated memory system of claim 8 or 9 wherein said status storage means is a random access memory (RAM); said word read from said RAM comprising four bits; one said word representing both the read and the write status of one memory module in said first memory bank and the read and the write status of the one corresponding memory module in said second memory bank; one bit representing the status of the read operation of one memory module in said first memory bank, a second bit representing the status of the write operation of that same memory module in said first memory bank, a third bit representing the status of the read operation of the one corresponding memory module in said second memory bank, and a fourth bit representing the status of the write operation of that same memory module in said second memory bank.

11. In a duplicated memory system for use with a central processing unit (CPU) wherein the duplicated memory system comprises a first memory bank and a second memory bank, each of said memory banks comprising a plurality of memory modules for storing a plurality of binary words in distinct addressable storage locations, with a unique address code defining both one addressable storage location in a memory module in said first memory bank and one addressable storage location in a memory module in said second memory bank, the method of operating said duplicated memory system characterized by:
- storing, in a status storage means, both the read status and the write status of each memory module in both said first memory bank and said second memory bank;
- supplying said duplicated memory system with a unique address code that defines both one distinct addressable storage location in a memory module in said first memory bank and one distinct addressable storage location in a memory module in said second memory bank;
- supplying said duplicated memory system with a control command either to read data information from said addressed location or to write data information into said addressed location;
- selectively accessing, in response to both said control command and said read and write status, the addressable storage locations in said first and second memory banks; and
- storing, in said status storage means, the updated read status and write status of each memory module after each said memory module has been accessed.

12. The method of claim 11 wherein said status storage means is interrogated, after said address code has been received, but before any read or write command is executed by said duplicated memory system, to determine the read and write status of said memory modules being addressed and to thereby determine if said read or write commands should be executed for that particular memory module.

13. The method of claim 12 further including the step of updating the read and write status for said addressed modules after each said memory module has been accessed.

14. The method of claim 12 or 13 wherein, for a read command, priority is given to extract the stored information from the addressed memory module in said first memory bank when neither the addressed memory module in said first memory bank nor the addressed memory module in said second memory bank is indicated as being inhibited from responding to a read command.

* * * * *